United States Patent

Proebsting

[15] 3,702,985

[45] Nov. 14, 1972

[54] MOS TRANSISTOR INTEGRATED MATRIX

[72] Inventor: Robert J. Proebsting, Richardson, Tex.

[73] Assignee: Texas Instruments Incorporated, Dallas, Tex.

[22] Filed: April 30, 1969

[21] Appl. No.: 820,535

[52] U.S. Cl. ........................340/166 R, 340/166 FL

[51] Int. Cl. ..............................................H04q 3/00

[58] Field of Search..................................340/166 R

[56] References Cited

UNITED STATES PATENTS

| | | | |
|---|---|---|---|
| 3,307,148 | 2/1967 | Fukamachi | 340/166 |
| 3,308,433 | 3/1967 | Lochinger | 340/166 |
| 3,312,941 | 4/1967 | Booth | 340/166 |
| 3,490,001 | 1/1970 | Schroeder | 340/166 X |
| 3,493,932 | 2/1970 | Yu | 340/167 X |
| 2,716,156 | 8/1955 | Harris | 340/166 |
| 3,157,740 | 11/1964 | Crafts | 340/166 X |
| 3,453,421 | 7/1969 | Tonnesson | 340/166 X |
| 3,550,089 | 12/1970 | Ahrons | 340/166 |

*Primary Examiner*—Harold I. Pitts

*Attorney*—Samuel M. Mims, Jr., James O. Dixon, Andrew M. Hassell, Harold Levine, Melvin Sharp, John E. Vandigriff, Henry T. Olsen and Michael A. Sileo, Jr.

[57] ABSTRACT

A mass production large scale integrated logic circuit formed on a single substrate which can be custom programmed by modification of a single fabrication mask to perform random logic is disclosed. The circuit includes a first programmable matrix of voltage controlled devices for generating product terms from its inputs and a second programmable matrix of voltage controlled devices for summing the product terms so that a large number of inputs can be accepted while reducing the number of voltage control devices required in a manner that provides practical realization in semiconductor integrated circuit form and is suitable for a wide range of custom applications.

8 Claims, 3 Drawing Figures

INVENTOR:
ROBERT J. PROEBSTING

ATTORNEY

INVENTOR:
ROBERT J. PROEBSTING

ATTORNEY

MOS TRANSISTOR INTEGRATED MATRIX

This invention relates to logic circuits and more particularly to programmable random logic circuits suitable for embodiment in semiconductor integrated circuit form.

The present trend in the semiconductor industry is toward large scale integration of more and more functions on a single substrate, such as the discretionary wiring approach where variable multilevel interconnections are provided to interconnect the many intrarelated identical function cells on the semiconductor substrate, and the master slice approach where metal interconnections are provided to interconnect the many intrarelated variable function cells on the semiconductor substrate. These techniques are most suitable for high production volume requirements and need many special masks for a particular user, because the array of cells on a given semiconductor substrate are generally not useful to more than one customer.

Another approach to large scale integration is read only memories (ROM) in metal-insulator-semiconductor integrated circuit (MOSIC) form. This approach utilizes a decoder comprised of a matrix of rows and columns of potential transistors programmed to provide a matrix of actual MOS transistors for accepting the inputs of the ROM at the input rows of the decoder. The number of inputs to an ROM is limited to a small number because the number of input rows of the matrix is equal to twice the number of true logic inputs and the number of minterm output columns of the matrix is equal to $2^{I}n$, where $I_n$ is the number of logic inputs. Thus, the total number of potential MOS transistors vastly increases with an increase in the number of inputs. Consequently, such an approach is not generally suitable for random logic circuits in integrated circuit form where 20 inputs and twenty outputs would typically be required by a user because a ROM would require over 20 million potential MOS transistors in the matrices.

This invention is concerned with a unique approach to large scale integration of random logic circuits formed on a single substrate that is more cost effective, that limits the number of special masks required for a particular user, that is suitable for a wide range of users, and that is applicable to random logic circuits made in high production volume as well as low production volumes.

In a preferred embodiment of this invention, a matrix of potential voltage controlled devices such as MOS transistors, arrayed in input rows and output columns is provided on a semiconductor substrate in the manner described and claimed in copending patent application Ser. No. 567,459, filed July 25, 1966, by Crawford and Biard, entitled "Binary Decoder" and assigned to the assignee of the present application, (now U.S. Pat. No. 3,541,543, issued Nov. 17, 1970) which copending patent application is incorporated herein by reference. In accordance with the present invention, the matrix of potential MOS transistors is programmed to provide a product term generator for receiving the inputs to the random logic circuit in a manner such that a large number of inputs and/or their complements can be received without unduly multiplying the number of output columns of the matrix and the total number of potential transistors in the matrix since according to the present invention, all the product terms on the output columns of the matrix are not dependent on all the inputs to the matrix and the number of potential MOS transistors per output column of the matrix is not dependent on the number of inputs to the matrix. Accordingly, the number of actual transistors in at least one of the output columns of the matrix is less than the number of independent logic inputs. Moreover, a second matrix of potential MOS transistors comprised of input columns and output rows is provided on the same semiconductor substrate as the product term generator and is programmed to provide actual transistors for selectively receiving the product terms at the output columns of the product term generator for producing at its output rows sums of the selected product terms.

It should be noted that any logic expression can be defined as a sum of products. Because of the capability of the present invention to receive a large number of inputs and generate a large number of product terms therefrom, there is little or no restriction on the type of random logic circuits that can be implemented on a single substrate according to the present invention, even considering the present state of the MOSIC art. For example, to produce a random logic circuit having 20 independent inputs, 100 product terms, and 20 sum of product outputs according to the present invention requires only 6,000 potential transistors in the matrices in comparison to the aforementioned 20 million potential transistors required by the ROM approach, thus making a random logic circuit according to the present invention feasible for formation on a single substrate using current MOSIC technology.

The invention, as well as other objects, features and advantages thereof, may best be understood by reference to the following detailed description of an illustrative embodiment, when read in conjunction with the accompanying drawings, wherein.

Figure 1:
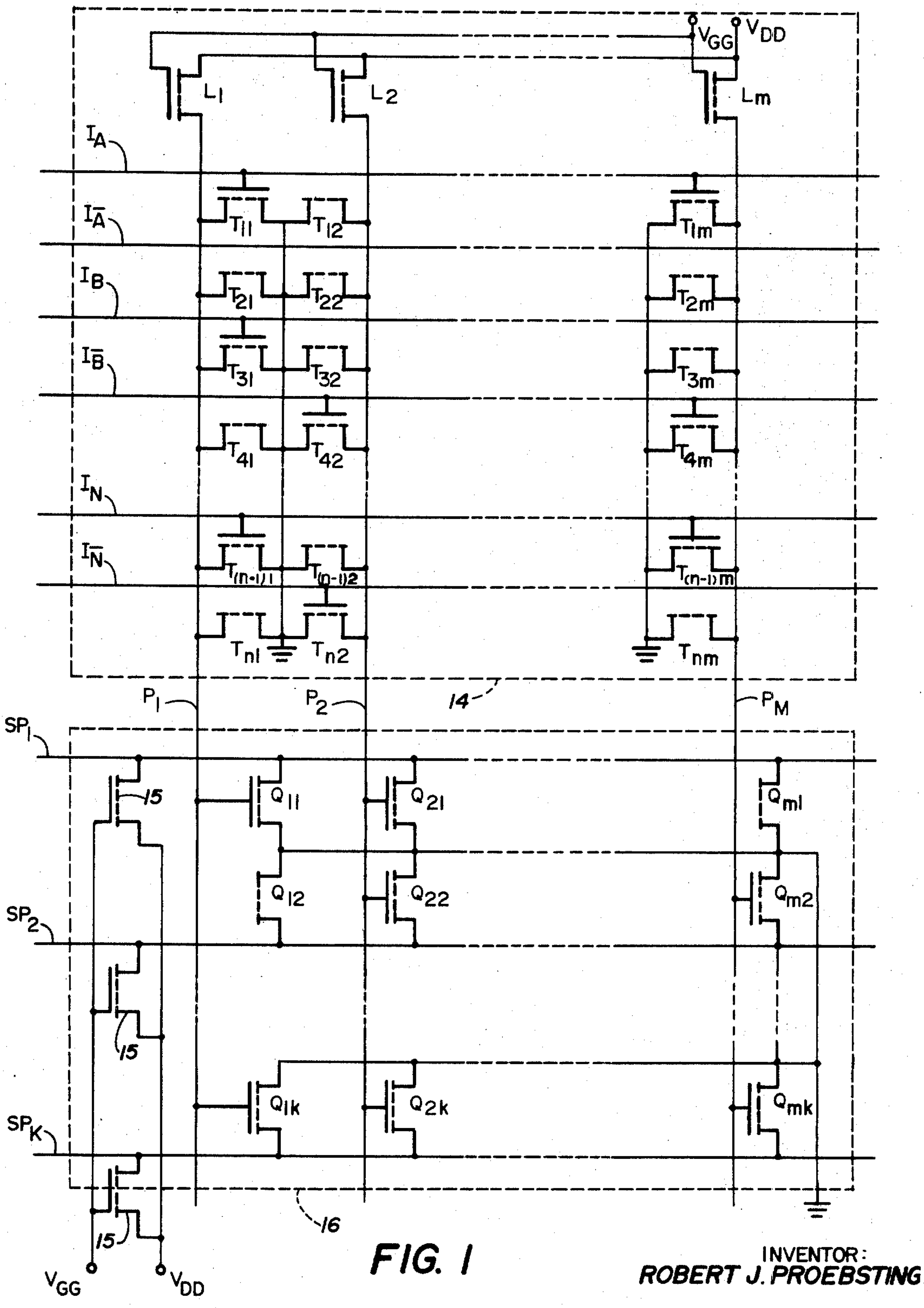
FIG. 1 is a schematic circuit diagram of a random logic circuit according to the present invention.

Referring now to the drawings, a random logic circuit of voltage control devices, such as metal-insulator-semiconductor (MOS) transistors in accordance with the present invention is illustrated in FIG. 1. In the preferred embodiment, the circuit is fabricated on a substrate 12 comprised of a single monolithic semiconductor wafer which is typically single crystal silicon. However, the substrate may be other semiconductor material such as germanium or gallium arsenide, or silicon formed on sapphire or other insulating substrates on which voltage controlled devices are provided in accordance with the present invention. The circuit includes a product term generator 14 which has a plurality of true binary inputs I, each of which is inverted on the substrate to provide complement inputs $\bar{I}$, and a plurality of binary product term outputs or their complements P. The outputs P are also the inputs of a sum of product term generator 16. The sum of product term generator 16 has a plurality of binary outputs SP. Based on current MOSIC fabrication technology, a random logic circuit according to the present invention may have from 20–40 independent binary inputs I, from 60–120 product term outputs P, and from 20–40 sum of product outputs SP, resulting in from 2,400 to 9,600 potential transistors in the product term generator matrix, and from 1,200 to 4,800 potential transistors in the sum of product term generator matrix.

The product term generator 14 is comprised of a matrix of potential metal-insulator-semiconductor transistors which are arrayed in input rows and output columns. For example, the top input row includes potential transistors $T_{11}$–$T_{1m}$, and the left-hand output column includes potential transistors $T_{11}$–$T_{n1}$. The drains of the potential transistors in each output column are common with the respective product term outputs $P_1$–$P_M$and are connected through load transistors $L_1$–$L_M$ to a drain voltage supply $V_{DD}$. The gates of the load transistors are common and are connected to a gate voltage $V_{GG}$ so as to provide a load resistance. The sources of all transistors are common and are connected to ground.

The product term generator is programmed to provide actual transistors by effectively connecting selected gates of the potential transistors to the respective inputs. For example, if inputs $I_A$, $I_B$ and $I_N$ are connected to the gates of transistors $T_{11}$, $T_{31}$ and $T_{(n-1)1}$, product term output $P_1$ will represent the product term $\overline{I_A I_B I_{NA}}$, when using p-channel transistors and positive logic, where ground is logic "1" and the negative supply voltage is logic "0." Similarly, if inputs $I_{\bar{B}}$ and $I_{\bar{N}}$ are effectively connected to the gates of transistors $T_{42}$ and $T_{n2}$, product term output $P_2$ will be equal to $\overline{I_{\bar{B}} I_{\bar{N}}}$. If inputs $I_A$, $I_{\bar{B}}$ and $I_N$ are connected to the gates of transistors $T_{1m}$, $T_{4m}$ and $T_{(n-1)m}$, product term output $P_M$ will be equal to $\overline{I_A I_{\bar{B}} I_N}$.

The sum of product term generator 16 is similarly comprised of a matrix of potential transistors arrayed in input columns and in output rows. The drains of the transistors $Q_{11}$–$Q_{m1}$ in top output row are common and form sum of product term output $SP_1$, the drains of the transistors $Q_{12}$–$Q_{m2}$ in the second output row are common and form sum of product term output $SP_2$, and the drains of transistors $Q_{1k}$–$Q_{mk}$ in the bottom output row are common and form sum of product term output $SP_K$. Each product term output SP is connected through a load transistor 15 to the voltage supply $V_{DD}$ and the gates of the load transistors are connected to the gate supply voltage $V_{GG}$. The sources of all of the transistors of the sum of product term generator 16 are common and are connected to ground.

The sum of products term generator 16 is programmed by selectively connecting transistors to the product term outputs $P_1$–$P_M$. For example, product term output $P_1$ is connected to the gates of actual transistors $Q_{11}$ and $Q_{1k}$, product term output $P_2$ is connected to the gate of actual transistors $Q_{21}$, $Q_{22}$ and $Q_{2k}$, and product term output $P_M$ is connected to the gates of actual transistors $Q_{m2}$ and $Q_{mk}$. Accordingly, the outputs from the random logic circuit of FIG. 1 may be expressed as:

$SP_1 = \overline{P}_1 + \overline{P}_2 = I_A I_B I_N + I_{\bar{B}} I_{\bar{N}}$,
$SP_2 = \overline{P}_2 + \overline{P}_M = I_{\bar{B}} I_{\bar{N}} + I_A I_{\bar{B}} I_N$, and
$SP_K = \overline{P}_1 + \overline{P}_2 + \overline{P}_M = I_A I_B I_N + I_{\bar{B}} I_{\bar{N}} + I_A I_{\bar{B}} I_N$ when using the positive logic and p-channel transistors as mentioned previously, or negative logic and n-channel transistors. All the potential and actual transistors of the matrices are not specifically illustrated in FIGS. 1 and 2 for simplicity.

Figure 2:
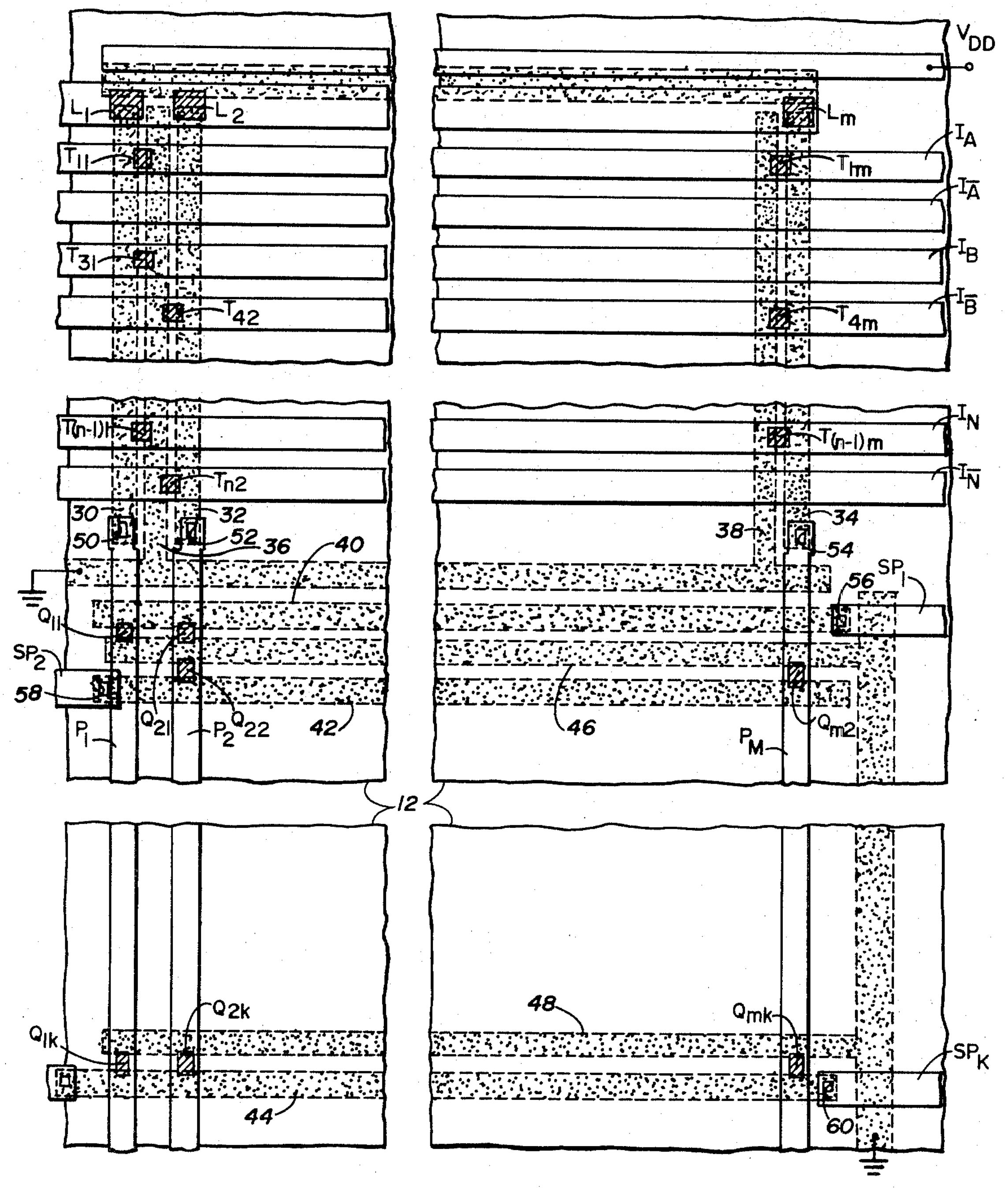
FIG. 2 is a simplified schematic plan view of an MOSIC illustrating the circuit shown in FIG. 1; an FIG. 3 is a schematic diagram illustrating a typical random logic circuit in accordance with this invention.

It will be noted that each output column of actual transistors in the product term generator 14 functions as a NAND gate and that each output row of actual transistors of the sum of product term generator 16 similarly functions as a NAND gate when using p-channel devices and positive logic. The transistors may also be n-channel devices, in which case negative logic and the same program would perform the same logic functions. On the other hand, if either p-channel devices and negative logic (where the more negative voltage represents the logic "1" state), or n-channel devices and positive logic are usEd, both matrices 14 and 16 function as NOR gates. Then the first matrix may be considered a programmable sum term generator and the second matrix a programmable product of sum term generator. For example, if negative logic is used with p-channel transistors programmed as illustrated in FIG. 2, the output functions become:

$SP_1 = \overline{P}_1 \overline{P}_2 = (I_A + I_B + I_N)(I_{\bar{B}} + I_{\bar{N}})$,
$SP_2 = \overline{P}_2 \cdot \overline{P}_M = (I_{\bar{B}} + I_{\bar{N}})(I_A + I_{\bar{B}} + I_N)$, and
$SP_K = \overline{P}_1 \cdot \overline{P}_2 \cdot \overline{P}_M = (I_A + I_B + I_N)(I_{\bar{B}} + I_{\bar{N}})(I_A + I_{\bar{B}} + I_N)$.

The same output functions would be produced using n-channel transistors and positive logic. Accordingly, the term "product term generator" used herein also comprehends a "sum term" generator when using p-channel devices and negative logic or n-channel devices and positive logic; and the term "sum of product term generator" used herein also comprehends a "product of sum term" generator when using p-channel devices and negative logic or n-channel devices and positive logic.

Either generator 14 or 16 or both may be grounded source as in the embodiment illustrated or a source follower type circuit, the outputs being followed as necessary by inverters to provide true or complement logic outputs as required.

It is noted that in accordance with the present invention at least one output column of the product term generator contains less actual transistors than the number of independent inputs I, such as output column $T_{12}$–$T_{n2}$ which is not a function of input $I_A$ or its complement $I_{\bar{A}}$.

The random logic circuit illustrated in FIG. 1 is preferably embodied in MOSIC form on a single semiconductor substrate which is illustrated in the partial schematic plan view of FIG. 2 wherein corresponding elements are designated by corresponding reference characters. The process for fabricating the circuit of FIG. 2 is described in detail in the said copending patent application. The process generally involves using a single diffusion step to form all of the diffusions of the circuit which are shown in dotted outline and are lightly stippled for emphasis. For example, diffusion 30 forms the common drain for the transistors in the left-hand output column, thus forming product term output $P_1$, diffusion 32 forms the common drain for the transistors in the second output column, thus forming product output $P_2$, and diffusion 34 forms the common drain for the transistors in right-hand output column, thus forming product term output $P_M$. Diffusions 36 and 38 form the common sources for these transistors. Similarly, diffusions 40, 42 and 44 form the drains of the transistors in three output rows which form the sum of product term outputs $SP_1$, $SP_2$ and $SP_K$, respectively. Diffusions 46 and 48 form the common source diffusions for the transistors in the sum of product term generator 16.

The entire slice is covered with a layer of insulation, such as a silicon dioxide, except in areas where metal contact is to be made with an underlying diffused region. Metal strips $I_4$–$I_N$ and $P_1$–$P_M$ are then formed on the insulating layer and extend at an angle to the underlying diffused regions so that a potential transistor is formed at the intersection of each of the metal strips and adjacent source and drain regions. The metal strips $P_1$–$P_M$ are in electrical contact with the respective common drain regions, through windows or openings 50, 52 and 54, for example, in the insulating layer.

The oxide layer may be formed by two different steps so that it may be made selectively thin at the potential transistor sites where an actual transistor is desired, and made thick at those potential transistor sites where no transistor is required to perform the desired logic function. Thus, when the matrices of potential transistors are programmed as illustrated in FIGS. 1 and 2, actual transistors are formed at sites $T_{11}$, $T_{1m}$, $T_{31}$, $T_{42}$, $T_{4m}$, $T_{(n-1)1}$, $T_{(n-1)m}$ and $T_{n2}$ in the product term generator 14, and at sites $Q_{11}$, $Q_{21}$, $Q_{22}$, $Q_{m2}$, $Q_{1k}$, $Q_{2k}$ and $Q_{mk}$ in the sum of product term generator 16. Outputs $SP_1$, $SP_2$ and $SP_M$ are metallized strips connected to the respective diffused regions 40, 42 and 44 through openings 56, 58 and 60, respectively, in the oxide.

In practice, a family of random logic circuits may be designed based upon the number of binary logic inputs I, the number of product terms, and the number of binary logic outputs. Then all of the masks used in fabricating each standard circuit would be identical except for the mask defining the location of the thin oxide areas forming the actual transistors. This would be programmed to produce the product terms at the outputs $P_1$–$P_M$ and then the sum of product terms at the outputs SP for the particular application of the circuit. This mask can also be used to program the openings in the insulating layer so that the metallization layer will interconnect the inputs and outputs of the generators in a variety of selectable combinations to accomplish substantially any desired logic functions. Such programming can readily be accomplished and the mask generated by a digital computer. Moreover, the invention may be practiced using a complementary transistor approach where n-channel and p-channel transistors are used on the same substrate with the n-channel transistors provided in the matrices and the p-channel transistors provided as load impedances or vice versa or the load impedances may be deposited resistors on the oxide or other resistance means. Furthermore, selected ones of the outputs of the sum of product term generator 16 may be fed back to the inputs I of the product term generator 14 or fed to a further product term generator for producing desired product terms of the sums of product terms and further connected into generator 16 or another sum of product term generator to sum these product terms all on the same substrate.

Figure 3:
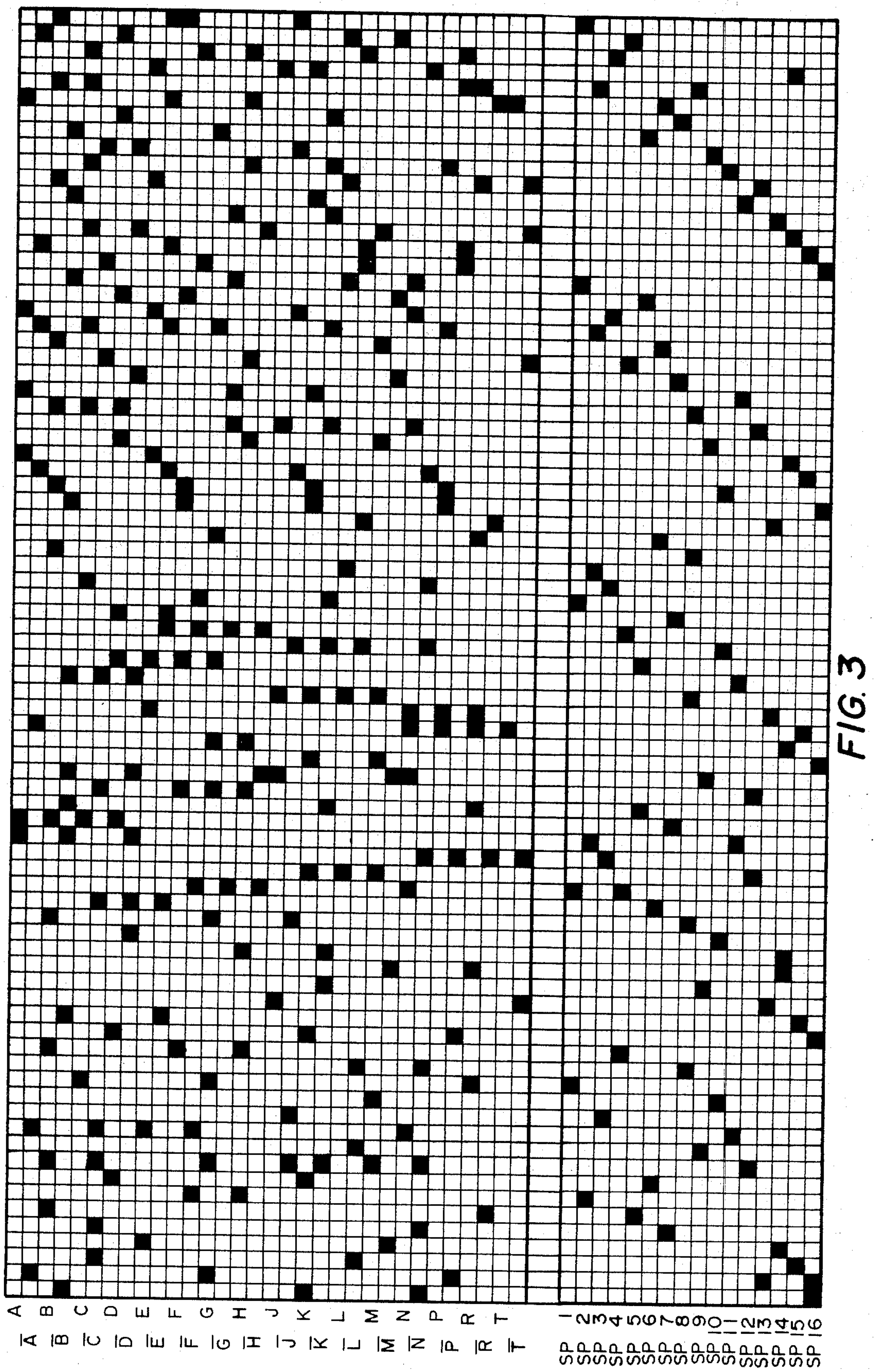

FIG. 3 schematically represents a product term matrix of potential transistors in accordance with this invention having 32 input rows which receive 16 independent binary inputs A, B, C, D, E, F, G, H, J, K, L, M, N, P, R, and T and the complements $\overline{A}$, $\overline{B}$, $\overline{C}$, $\overline{D}$, $\overline{E}$, $\overline{F}$, $\overline{G}$, $\overline{H}$, $\overline{J}$, $\overline{K}$, $\overline{L}$, $\overline{M}$, $\overline{N}$, $\overline{P}$, $\overline{R}$, and $\overline{T}$, and 80 product term columns, and a sum of product term matrix having 80 input columns corresponding to the product term outputs, and 16 sum of product output rows SP 1 – SP 16. The solid squares of the matrix represent actual transistors. The logic outputs of the matrix as programmed may therefore be expressed as follows:

$SP\,1 = CGR + \overline{FGH}N + \overline{F}K + B\overline{GL}N + B\overline{E}F\overline{J}$ $SP\,2 = \overline{F}H + A\overline{BD} + L + \overline{A}C\overline{E}G\overline{K}P + BC\overline{P}R$ $SP\,3 = \overline{J} + \overline{NPRT} + C\overline{N} + AE\overline{J}N + C\overline{F}H\overline{LP}$ $SP\,4 = B\overline{F}H + \overline{FGH}N + \overline{EFGH} + \overline{C}H\overline{T} + \overline{A}DL\overline{M}$ $SP\,5 = B\overline{R} + \overline{BKR} + DEFG + DF\overline{M} + \overline{B}G$ $SP\,6 = DK + \overline{CDE} + GR + BM + A\overline{E}H\overline{R}T$ $SP\,7 = \overline{CN} + ABCD + D\overline{E} + \overline{DM} + D\overline{K}$ $SP\,8 = \overline{LN} + BG\overline{J} + JKLM + B + BCD + BC\overline{P}R$ $SP\,9 = \overline{L} + \overline{K} + \overline{BDHJMN} + DHM + \overline{CDJ}$ $SP\,10 = M + \overline{D} + \overline{JKLN} + BFKP + CH\overline{K}P$ $SP\,11 = A\overline{C}E\overline{F}N + A\overline{BD} + \overline{BCD} + A\overline{G}K + \overline{B}K$ $SP\,12 = B\overline{C}G\overline{JKMN} + KLM + \overline{C}FGH + \overline{G}J\overline{K}N + BELR\overline{T}$ $SP\,13 = \overline{A}G\overline{P} + J\overline{T} + ENPR + L\overline{R} + \overline{GK}$ $SP\,14 = E\overline{M} + \overline{M}R + H\overline{K} + GH + AE + C\overline{DHM}\overline{T} + EJK\overline{N}$ $SP\,15 = \overline{CL} + \overline{BE} + \overline{A}NPRT + \overline{AEJN} + \overline{AELP}$ $SP\,16 = \overline{B}K\overline{N} + \overline{AGP} + DK\overline{P} + KM + \overline{B}FKP + \overline{CFLP}$ From the foregoing, it will be evident to those skilled in the art that substantially any random logic can be performed simply by programming the standard matrix in the manner illustrated.

Although a preferred embodiment of the invention has been described in detail, it is to be understood that various changes, substitutions, and alterations can be made therein without departing from the spirit and scope of the invention.

What is claimed is:

1. A logic circuit comprising a semiconductor substrate, a matrix of input rows and output columns of substantially identical voltage controlled semiconductor devices each having a control electrode on said substrate, generally parallel input conductors forming input rows to said matrix for respectively and substantially simultaneously receiving a plurality of both true logic signals and the complements thereof, and respectively connecting in common the control electrode of each voltage controlled device in an input row, another electrode of each voltage control device in each output column being connected in common to form output terminals for said output columns, and a third electrode of each device connected to a common reference potential, the number of voltage controlled devices in at least one output column being less than the number of input conductors to said matrix for receiving said true logic signals, said voltage controlled devices in said matrix being selectively arrayed in rows and columns to produce at said output terminals signals representative of selected combinations of input signals on said input conductors.

2. A logic circuit comprising a substrate, a first matrix of input rows and output columns of voltage controlled devices on said substrate, generally parallel input conductors forming input rows to said first matrix and connecting in common the control electrode of each voltage controlled device in an input row, another electrode of each voltage control device in each output column being connected in common to form output terminals for said output columns, the number of voltage controlled devices in at least one output column being less than the number of independent input signals to said first matrix said voltage controlled devices in said first matrix being arrayed to produce at said output terminals signals representative of selected combinations of said input signals, a second matrix of input columns and output rows of said voltage controlled devices on said substrate, generally parallel second input conductors connecting the control electrode of each voltage controlled device in an input column of said second matrix in common, another electrode of each voltage controlled device in an output row of said second matrix being connected in common to form output terminals for said output rows of said second matrix, means connecting a further electrode of each voltage controlled device in said second matrix in common, means connecting the output terminals of said first matrix to said second input conductors, said voltage controlled devices of said second matrix being arrayed in said second matrix to provide at the output terminals of said second matrix signals representative of selected combinations of the terms appearing at the output terminals of said first matrix.

3. A logic circuit according to claim 2 wherein said input conductors of said first matrix are adapted to supply true input signals and their complements to said first matrix and said at least one output row consists of a number of voltage controlled devices less than half the number of said input signals and their complements.

4. A metal-insulator-semiconductor integrated circuit comprising a semiconductor substrate, a matrix of input rows and output columns of potential MOS transistors formed on said substrate at each matrix intersection, generally parallel input rows of conductors for respectively receiving substantially simultaneously a plurality of both true logic signals and the complement thereof, each connecting in common the gate electrode of the potential MOS transistors in a respective input row, one of the drain or source electrodes of each potential MOS transistor in an output column being connected in common to form output terminals corresponding to the output columns of said matrix, means connecting the other one of said source or drain electrodes of each of said MOS transistors in common to a reference potential, selected ones of said potential MOS transistors at the intersections of said rows and columns of said matrix having different structural characteristics than the remaining ones of said potential MOS transistors to produce actual transistors only at said selected intersections, said remaining transistors being inoperative, the number of actual transistors in at least one output column of said matrix being less than the number of said input conductors to said matrix for receiving said true input signals, said intersections having actual transistors, the gate electrodes of which are respectively connected to said input conductors, being arrayed in said row and column matrix to provide output signals at said output terminals which are representative of selected combinations of said input signals applied to said input conductors.

5. A metal-insulator-semiconductor integrated circuit comprising a semiconductor substrate, a first matrix of input rows and output columns of potential MOS transistors formed on said substrate, generally parallel input rows of conductors each connecting in common the gate electrode of the potential MOS transistors in a respective input row, one of the drain or source electrodes of each potential MOS transitor in an output column being connected in common to form output terminals corresponding to the output columns of said first matrix, means connecting the other one of said source or drain electrodes of each of said MOS transistors in common, selected ones of said potential MOS transistors at the intersections of said rows and columns of said first matrix having different structural characteristics than the remaining ones of said potential MOS transistors to produce actual transistors at said selected intersections and remaining inoperative transistors, said input conductors being adapted to receive at least true input signals for said first matrix, the number of actual transistors in at least one output column of said first matrix being less than the number of true input signals and said intersections being selected to provide output signals at said output terminals which are representative of selected combinations of said input signals, and a second matrix of input columns and output rows of voltage controlled devices on said substrate, generally parallel second input conductors connecting the control electrode of each voltage controlled device in an input column of said second matrix in common, another electrode of each voltage controlled device in an output row of said second matrix being connected in common to form output terminals for said output rows of said second matrix, means connecting a further electrode of each voltage controlled device in said second matrix in common, means connecting the output terminals of said first matrix to said second input conductors, said voltage controlled devices of said second matrix being arrayed in said second matrix to provide at the output terminals of said second matrix signals representative of selected combination of the terms appearing at the output terminals of said first matrix.

6. A logic circuit according to claim 5 wherein said input conductors are adapted to supply true input signals and their complements to said first matrix and said at least one output column consists of a number of voltage controlled devices less than half the number of said input signals and their complements.

7. A logic circuit comprising a substrate, a first matrix of input rows and output columns of voltage controlled devices on said substrate, generally parallel input conductors forming input rows to said matrix and connecting in common the control electrode of each voltage controlled device in an input row, another electrode of each voltage control device in each output column being connected in common to form output terminals for said output columns, the number of voltage controlled devices in at least one output column being less than the number of independent input signals to said matrix, said voltage controlled devices in said matrix being arrayed to produce at said output terminals signals representative of selected combinations of said input signals, a second matrix of input columns and output rows of voltage controlled devices on said substrate, generally parallel second input conductors connecting the control electrode of each voltage controlled device in an input column of said second matrix in common, another electrode of eaCh voltage controlled device in an output row of said second matrix being connected in common to form output terminals for said output rows of said second matrix, means connecting a further electrode of each voltage controlled device in said second matrix in common, means connecting the output terminals of said first matrix to said second input conductors, said voltage controlled devices of said second matrix being arrayed in said second matrix to provide at the output terminals of said second matrix signals representative of selected combinations of the terms appearing at the output terminals of said first matrix.

8. A metal-insulator-semiconductor integrated circuit comprising a semiconductor substrate, a first matrix of input rows and output columns of potential MOS transistors formed on said substrate, generally parallel input rows of conductors each connecting in common the gate electrode of the potential MOS transistors in a respective input row, one of the drain or source electrodes of each potential MOS transistor in an output column being connected in common to form output terminals corresponding to the output columns of said matrix, means connecting the other one of said source or drain electrodes of each of said MOS transistors in common, selected ones of said potential MOS transistors at the intersections of said rows and columns of said matrix having different structural characteristics than the remaining ones of said potential MOS transistors to produce actual transistors at said selected intersections and remaining inoperative transistors, said input conductors being adapted to receive at least true input signals for said matrix, the number of actual transistors in at least one output column of said matrix being less than the number of true input signals and said intersections being selected to provide output signals at said output terminals which are representative of selected combinations of said input signals, a second matrix of input columns and output rows of voltage controlled devices on said substrate, generally parallel second input conductors connecting the control electrode of each voltage controlled device in an input column of said second matrix in common, another electrode of each voltage controlled device in an output row of said second matrix being connected in common to form output terminals for said output rows of said second matrix, means connecting a further electrode of each voltage controlled device in said second matrix in common, means connecting the output terminals of said first matrix to said second input conductors, said voltage controlled devices of said second matrix being arrayed in said second matrix to provide at the output terminals of said second matrix signals representative of selected combinations of the terms appearing at the output terminals of said first matrix.

* * * * *